United States Patent
Kim

(10) Patent No.: US 7,750,718 B2
(45) Date of Patent: Jul. 6, 2010

(54) LEVEL SHIFTER USING COUPLING PHENOMENON

(75) Inventor: Saeng Hwan Kim, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/291,259

(22) Filed: Nov. 7, 2008

(65) Prior Publication Data

US 2009/0261884 A1 Oct. 22, 2009

(30) Foreign Application Priority Data

Apr. 22, 2008 (KR) .................. 10-2008-0037410

(51) Int. Cl.
 *H03L 5/00* (2006.01)
(52) U.S. Cl. .................. 327/333; 326/63; 326/81
(58) Field of Classification Search ............. 326/62–63, 326/80–81; 327/306, 333
 See application file for complete search history.

(56) References Cited

U.S. PATENT DOCUMENTS

| 5,619,162 | A  | * | 4/1997  | Ogihara ............... 327/537 |
| 6,987,412 | B2 | * | 1/2006  | Sutherland et al. ...... 327/333 |
| 7,348,801 | B2 |   | 3/2008  | Nojiri |
| 7,463,072 | B2 | * | 12/2008 | Kim et al. ............. 327/112 |

* cited by examiner

*Primary Examiner*—Dinh T. Le
(74) *Attorney, Agent, or Firm*—John P. White; Cooper & Dunham LLP

(57) ABSTRACT

A level shifter removes delay, which is generated at the time of transition of an input signal level, by adjusting a size of NMOS transistors to perform pull-down and pull-up operations. The level shifter includes a coupling unit for setting up a voltage level of a first node according to a voltage level of an input signal, a first buffer for transferring an output signal by buffering a signal from the first node, and a driving unit configured to receive the input signal and the output signal and drive the first node.

24 Claims, 3 Drawing Sheets

LEVEL SHIFTER USING COUPLING PHENOMENON

TECHNICAL FIELD

This disclosure relates to a semiconductor memory device and, more particularly, to a level shifter capable of preventing a delay component, which is caused by a level transition of an input signal, improving operation speed using a coupling phenomenon, and reducing a chip size of a semiconductor memory device.

BACKGROUND

Generally, the semiconductor memory devices, which have NMOS and PMOS transistors, include different circuits to be driven by different voltage levels. Since leakage current occurs when the circuits, which are driven by different voltage levels, are directly connected to each other, a level shifter is employed to prevent such the leakage current in the semiconductor memory devices.

The level shifter converts a low level input signal, which is driven by a low level driving circuit, into a high level output signal and transfers the high level output signal to a high level driving circuit, or converts a high level input signal, which is driven by a high level driving circuit, into a low level output signal and transfers the low level output signal to a low level driving circuit.

FIG. 1 is a circuit diagram illustrating a conventional level shifter.

As shown in FIG. 1, the conventional level shifter includes PMOS transistors P10 and P11 for a current mirror and NMOS transistors N10 and N11 which are selectively turned on in response to an input signal IN.

The operations of the conventional level shifter can be illustrated in the cases where the input signal IN goes from a first voltage level V1 to a ground voltage level VSS and goes from the ground voltage level VSS to the first voltage level V1.

First, when the input signal IN is at the first voltage level V1, the NMOS transistor N10 is turned off and the NMOS transistor N11 is turned on. Accordingly, a node nd11 is pull-down driven to the ground voltage level VSS so that the PMOS transistor P10 is turned on and a node nd10 is pull-up driven to a second voltage level V2. At this time, if the input signal IN goes to the ground voltage level VSS, the node nd10 is pull-down driven to the ground voltage level VSS by the NMOS transistor N10 which is turned on and the node nd11 is pull-up driven to the second voltage level V2 through the turn-on operation of the PMOS transistor P11. When the node nd11 is at the second voltage level V2, an output signal OUT is at the ground voltage level VSS through an inverter IV12.

Next, when the input signal IN is at the ground voltage level VSS, the NMOS transistor N10 is turned on and the NMOS transistor N11 is turned off. Accordingly, the node nd10 is pull-down driven to the ground voltage level VSS so that the PMOS transistor P11 is turned on and the node nd11 is pull-up driven to the second voltage level V2. At this time, if the input signal IN goes to the first voltage level V1, the node nd11 is pull-down driven to the ground voltage level VSS by the NMOS transistor N11 which is turned on. When the node nd11 is at the ground voltage level VSS, the output signal OUT is at the second voltage level V2 through the inverter IV12.

As mentioned above, the level shifter receives the input signal IN, which has a swing width between the first voltage level V1 and the ground voltage level VSS, and then outputs the output signal OUT which has a swing width between the second voltage level V2 and the ground voltage level VSS.

However, in the conventional level shifter, there is a delay section at the time of the pull-down operation to the ground voltage level VSS on the node nd10 because the turn-on states of the NMOS transistor N10 and the PMOS transistor P10 are simultaneously generated and such turn-on states are maintained for a predetermined section when the input signal IN transits from the first voltage level V1 to the ground voltage level VSS. This is a cause of the delay in the generation of the output signal OUT of the ground voltage level VSS. Further, in the conventional level shifter, there is a delay section at the time of the pull-down operation to the ground voltage level VSS on the node nd11 because the turn-on states of the NMOS transistor N11 and the PMOS transistor P11 are simultaneously generated and such turn-on states are maintained for a predetermined section when the input signal IN transits from the ground voltage level VSS to the first voltage level V1. This is a cause of the delay in the generation of the output signal OUT of the second voltage level V2. These causes of the delay are generated even if the voltage difference between the first voltage level V1 of the input signal IN and the second voltage level V2 of the output signal OUT is at a small range.

SUMMARY

In an aspect of this disclosure, a level shifter is provided for removing a delay, which is generated at the time of transition of an input signal level, by adjusting a size of NMOS transistors to perform pull-down and pull-up operations.

In another aspect of this disclosure, a level shifter is provided for improving operation speed by using a coupling phenomenon of a capacitor and for reducing a chip size by using a small number of NMOS transistors.

In an embodiment, a level shifter comprises a coupling unit for setting up a voltage level of a first node according to a voltage level of an input signal, a first buffer for transferring an output signal by buffering a signal from the first node, and a driving unit configured to receive the input signal and the output signal and drive the first node.

The coupling unit can include a second buffer driven by a first voltage level and a ground voltage level and configured to buffer the input signal and transfer the buffered input signal to a second node, and a coupling element connected between the first node and the second node and configured to maintain a constant voltage difference between the first node and the second node.

The coupling element can be a capacitor.

The first buffer can be driven by the ground voltage level and a second voltage level which is higher than the first voltage level.

The driving unit can include a pull-down element connected between the first node and the ground voltage level and configured to pull-down drive the first node in response to the input signal, and a pull-up element connected between the second voltage level and the first node and configured to pull-up drive the first node in response to the output signal.

The pull-down element and the pull-up element can be MOS transistors and a size of the pull-down MOS transistor is larger than that of the pull-up MOS transistor.

The first buffer can be driven by the second voltage level which is lower than the first voltage level and the ground voltage level.

The driving unit can include a pull-up element connected between the first voltage level and the first node and configured to pull-down drive the first node in response to the input signal, and a pull-down element connected between the first node and the second voltage level and configured to pull-down drive the first node in response to the output signal.

The pull-down element and the pull-up element can be MOS transistors and a size of the pull-up MOS transistor is larger than that of the pull-down MOS transistor.

In another embodiment, a level shifter comprises a first buffer for buffering an input signal and transferring the buffered input signal to a first node, a coupling element connected between the first and a second node configured to maintain a constant voltage difference between the first node and the second node, a pull-down element for pull-down driving the second node in response to the input signal, a second buffer for outputting an output signal by buffering a signal from the second node, and a pull-up element for pull-up driving the second node in response to the output signal.

In still another embodiment, a level shifter comprises a first buffer for buffering an input signal and transferring the buffered input signal to a first node, a coupling element connected between the first and a second node and configured to maintain a constant voltage difference between the first node and the second node, a pull-up element for pull-up driving the second node in response to the input signal, a second buffer for outputting an output signal by buffering a signal from the second node, and a pull-down element for pull-up driving the second node in response to the output signal.

In still another embodiment, a level shifter comprises a set-up unit for setting up a voltage level of a first node in response to an input signal, a first buffer for transferring an output signal by buffering a signal from the first node, and a pull-up element for pull-up driving the first node in response to the output signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, examples and embodiments of the present disclosure will be described with reference to accompanying drawings. However, the examples and embodiments are for illustrative purposes only and are not intended to limit the scope of the invention.

Figure 2:
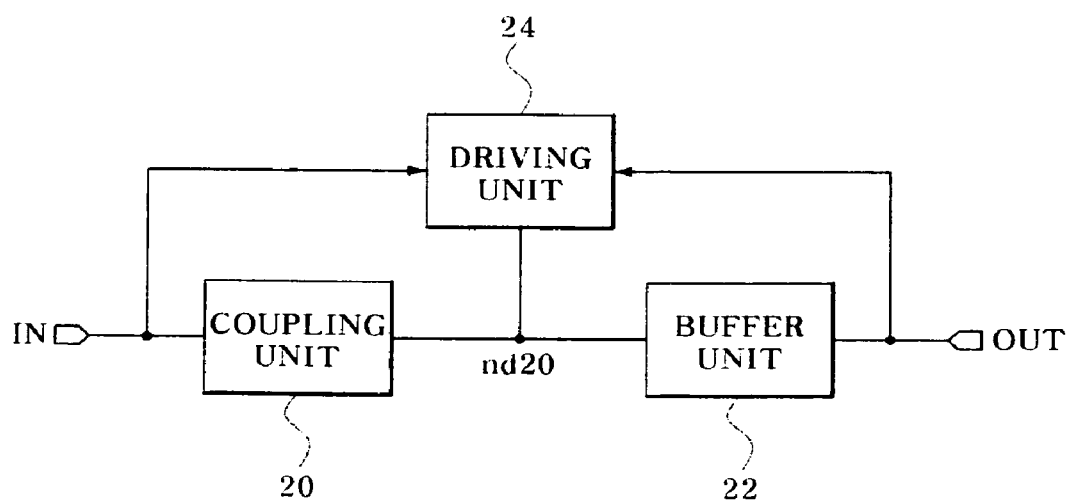
FIG. 2 is a block diagram illustrating an example of a level shifter according to the present disclosure.

FIG. 2 is a block diagram illustrating an example of a level shifter according to the present disclosure.

Referring to FIG. 2, the level shifter according to the present disclosure includes a coupling unit 20 to set up a voltage level of a node nd20 according to a voltage level of an input signal IN through a coupling phenomenon, a buffer unit 22 for transferring an output signal OUT by buffering a signal on the node nd20, and a driving unit 24 configured to receive the input signal IN and the output signal OUT and drive the node nd20.

Figure 3:
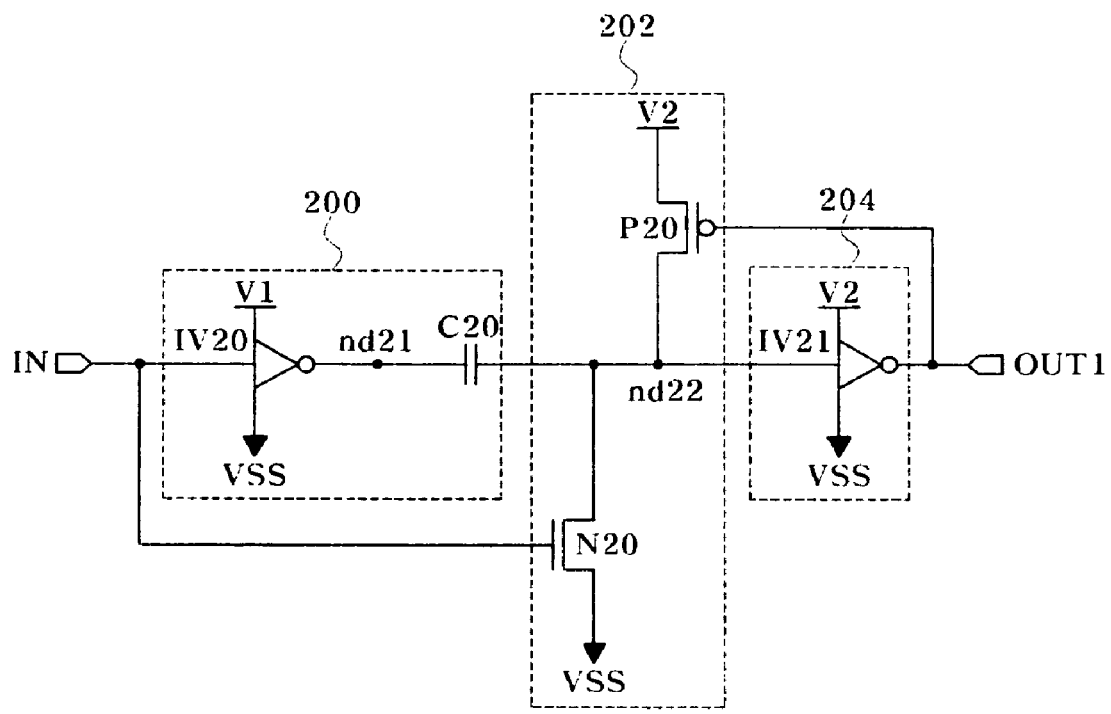
FIG. 3 is a circuit diagram for the level shifter of FIG. 2 according to an embodiment of the present disclosure.
Figure 4:
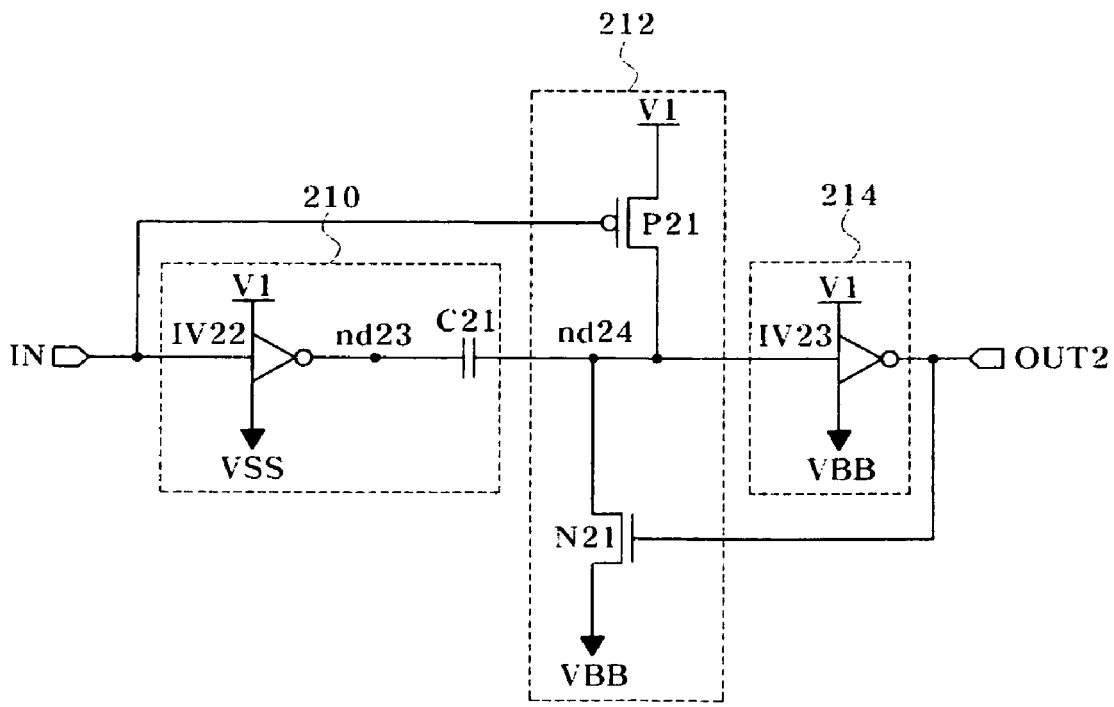
FIG. 4 is a circuit diagram for the level shifter of FIG. 2 according to another embodiment of the present disclosure.

The level shifter according to the present disclosure will be illustrated in detail referring to FIGS. 3 and 4.

First, FIG. 3 is a circuit diagram for the level shifter of FIG. 2 according to our embodiment of the present disclosure.

The level shifter shown in FIG. 3 includes a coupling unit 200, a driving unit 202, and a buffer unit 204.

The coupling unit 200 includes an inverter IV20 configured to invert and buffer the input signal IN and then transfer the buffered input signal IN to a node nd21, and a capacitor C20 connected between the node nd21 and a node nd22. Here, the inverter IV20 is driven between a first voltage level V1 and a ground voltage level VSS. For example, the inverter IV20 can includes a PMOS transistor (not shown), which is connected between the first voltage level V1 and the node nd21 and performs a pull-up operation in response to the input signal IN, and a NMOS transistor (not shown) which is connected between the node nd21 and the ground voltage level VSS and performs a pull-down operation in response to the input signal IN. Further, the capacitor C20 maintains a constant voltage difference between the nodes nd21 and nd22 through a coupling phenomenon.

The driving unit 202 includes an NMOS transistor N20, which is connected between the node nd22 and the ground voltage level VSS and performs the pull-down operation of the node nd22 in response to the input signal IN, and a PMOS transistor P20 which is connected between the node nd22 and the second voltage level V2 and performs the pull-up operation of the node nd22 in response to an output signal OUT1. Here, in the preferred embodiment, the size of the NMOS transistor N20 is larger than that of the PMOS transistor P20 so that the current drivability of the NMOS transistor N20 is higher than that of the PMOS transistor P20.

The buffer 204 includes an inverter IV21 driven by the second voltage level V2 which is higher than the first voltage level V1, and thereby has a swing range between the second voltage level V2 and the ground voltage level VSS. The buffer 204 inverts and buffers a signal from the node nd22 and then outputs the output signal OUT1.

The number of MOS transistors in the level shifter according to the present disclosure is reduced in number, as compared with the prior art. In detail, the level shifter according to the prior art has two PMOS transistors, two NMOS transistors and three inverters. On the other hand, the level shifter according to the present disclosure has one PMOS transistor, one NMOS transistor and two inverters. Accordingly, the size of the level shifter according to the present disclosure can be reduced.

The operations of the level shifter according to the present disclosure can be illustrated in the cases where the input signal IN goes from the first voltage level V1 to the ground voltage level VSS and goes from the ground voltage level VSS to the first voltage level V1.

First, when the input signal IN is at the first voltage level V1, the node nd21 is at the ground voltage level VSS and the node nd22 is also at the ground voltage level VSS because the NMOS transistor N20 is turned on. Accordingly, the output signal OUT1 is at the second voltage level V2 and the PMOS transistor P20 is turned off. At this time, the input signal IN goes to the ground voltage level VSS, the NMOS transistor N20 is turned off and the node nd21 is at the first voltage level V1. If the node nd21 is at the first voltage level V1, the node nd22 is also at the first voltage level V1 due to the coupling phenomenon. Accordingly, the output signal OUT1 is at the ground voltage level VSS and the node nd22 is pull-up driven to the second voltage level V2 because the PMOS transistor P20 is turned on.

The level shifter according to the present disclosure swiftly transfers the first voltage level V1 of node nd21 to the node nd22 by using the coupling phenomenon of the capacitor C20. Therefore, the operation speed of the level shifter can be improved.

Next, in a state where the input signal IN is at the ground voltage level VSS, that is, in a state where the NMOS transistor N20 is turned off, the PMOS transistor P20 is turned on, and the node nd22 is at the second voltage level V2, the NMOS transistor N20 is turned on if the input signal IN is transited to the first voltage level V1. At this time, all of the NMOS transistor N20 and the PMOS transistor P20 are turned on. However, the node nd22 is at the ground voltage level VSS because the size of the NMOS transistor N20 is larger than that of the PMOS transistor P20, i.e., the drivability of the NMOS transistor N20 is higher than that of the PMOS transistor P20, and the node nd22 is pull-down driven by the coupling phenomenon of the capacitor C20. Accordingly, the output signal OUT1 is outputted as the second voltage level V2.

As mentioned above, the level shifter according to the present disclosure pull-down drives the node nd22 to the ground voltage level VSS with the high speed using the NMOS transistor N20 of which the size is larger than that of the PMOS transistor P20, when the input signal transits from the ground voltage level VSS to the first voltage level V1. Accordingly, the cause of delay, which is generated when the NMOS transistor N20 and the PMOS transistor P20 are simultaneously turned on at the time of the level transition of the input signal IN, can be removed.

FIG. 4 is a circuit diagram illustrating the level shifter of FIG. 2 according to another embodiment of the present disclosure.

As shown in FIG. 4, the level shifter according to another embodiment of the present disclosure includes a coupling unit 210, a driving unit 212, and a buffer unit 214.

The coupling unit 210 includes an inverter IV22 to invert and buffer the input signal IN and then transfer the buffered input signal IN to node nd23, and a capacitor C21 connected between the node nd23 and a node nd24. Here, the inverter IV22 is driven between a first voltage level V1 and a ground voltage level VSS. Further, the capacitor C21 maintains a constant voltage difference between the nodes nd23 and nd24 through a coupling phenomenon.

The driving unit 212 includes a PMOS transistor P21 which is connected between the first voltage level V1 and the node nd24 and performs the pull-up operation of the node nd24 in response to the input signal IN, and an NMOS transistor N21, which is connected between the node nd24 and a back-bias voltage level VBB and performs the pull-down operation of the node nd24 in response to an output signal OUT2. Here, in the preferred embodiment, the size of the NMOS transistor N21 is smaller than that of the PMOS transistor P21 so that the current drivability of the NMOS transistor N21 is lower than that of the PMOS transistor P21.

The buffer 214 includes an inverter IV23 driven by the first voltage level V1 and the back-bias voltage level VBB which is lower than the ground voltage level VSS, and thereby has a swing range between the first voltage level V1 and the back-bias voltage level VBB. The buffer 214 inverts and buffers a signal from the node nd24 and then outputs the output signal OUT2.

The number of MOS transistors in the level shifter according to the present disclosure is reduced in number, as compared with the prior art. In detail, the level shifter according to the prior art has two PMOS transistors, two NMOS transistors and three inverters. On the other hand, the level shifter according to the present disclosure has one PMOS transistor, one NMOS transistor and two inverters. Accordingly, the size of the level shifter according to the present disclosure can be reduced.

The operations of the level shifter according to the present disclosure can be illustrated in the cases where the input signal IN goes from the ground voltage level to the first voltage level V1 and goes from the first voltage level V1 to the ground voltage level VSS.

First, when the input signal IN is at the ground voltage level VSS, the node nd23 is at the first voltage level V1 and the node nd24 is also at the first voltage level V1 because the PMOS transistor P21 is turned on. Accordingly, the output signal OUT2 is at the back-bias voltage level VBB and the NMOS transistor N21 is turned off. At this time, the input signal IN goes to the first voltage level V1, the PMOS transistor P21 is turned off and the node nd23 is at the ground voltage level VSS. If the node nd23 is at the ground voltage level VSS, the node nd24 is also at the ground voltage level VSS due to the coupling phenomenon of the capacitor C21. Accordingly, the output signal OUT2 is at the first voltage level V1 and the NMOS transistor N21 is turned on, and therefore the pull-down operation of the node nd24 is performed.

The level shifter according to the present disclosure swiftly transfers the ground voltage level VSS of node nd23 to the node nd24 by using the coupling phenomenon of the capacitor C21. Therefore, the operating speed of the level shifter can be improved.

Next, in a state where the input signal IN is at the first voltage level V1, that is, in a state where the PMOS transistor P21 is turned off, the NMOS transistor N21 is turned on, and the node nd24 is at the back-bias voltage level VBB, the PMOS transistor P21 is then turned on if the input signal IN is transited to the ground voltage level VSS. At this time, all of the NMOS transistor N21 and the PMOS transistor P21 are turned on. However, the node nd24 is at the first voltage level V1 because the size of the PMOS transistor P21 is larger than that of the NMOS transistor N21, i.e., the drivability of the PMOS transistor P21 is higher than that of the NMOS transistor N21, and the node nd24 is pull-up driven by the coupling phenomenon of the capacitor C21. Accordingly, the output signal OUT2 is outputted as the back-bias voltage level VBB.

As mentioned above, the level shifter according to the present disclosure pull-up drives the node nd24 to the first voltage level V1 with the high speed, by using the coupling phenomenon of the capacitor C21 and the PMOS transistor P21 of which the size is larger than that of the NMOS transistor N21, when the input signal transits from the first voltage level V1 to the ground voltage level VSS. Accordingly, the cause of delay, which is generated when the NMOS transistor N21 is turned on at the time of the level transition of the input signal IN, can be removed.

Figure 1:
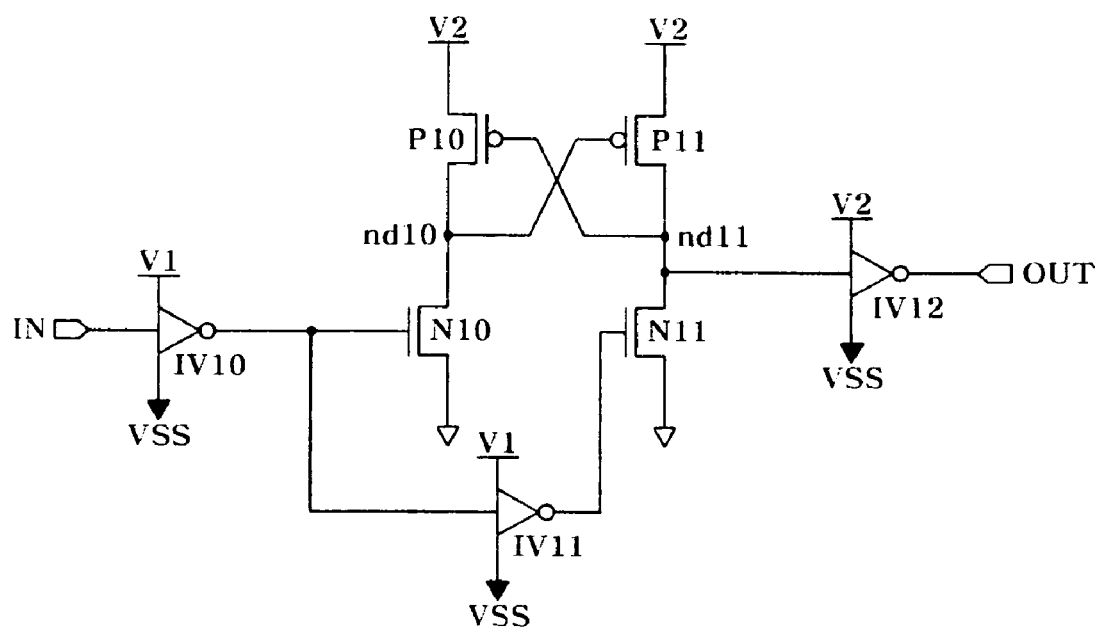
FIG. 1 is a circuit diagram illustrating a conventional level shifter.
Figure 5:
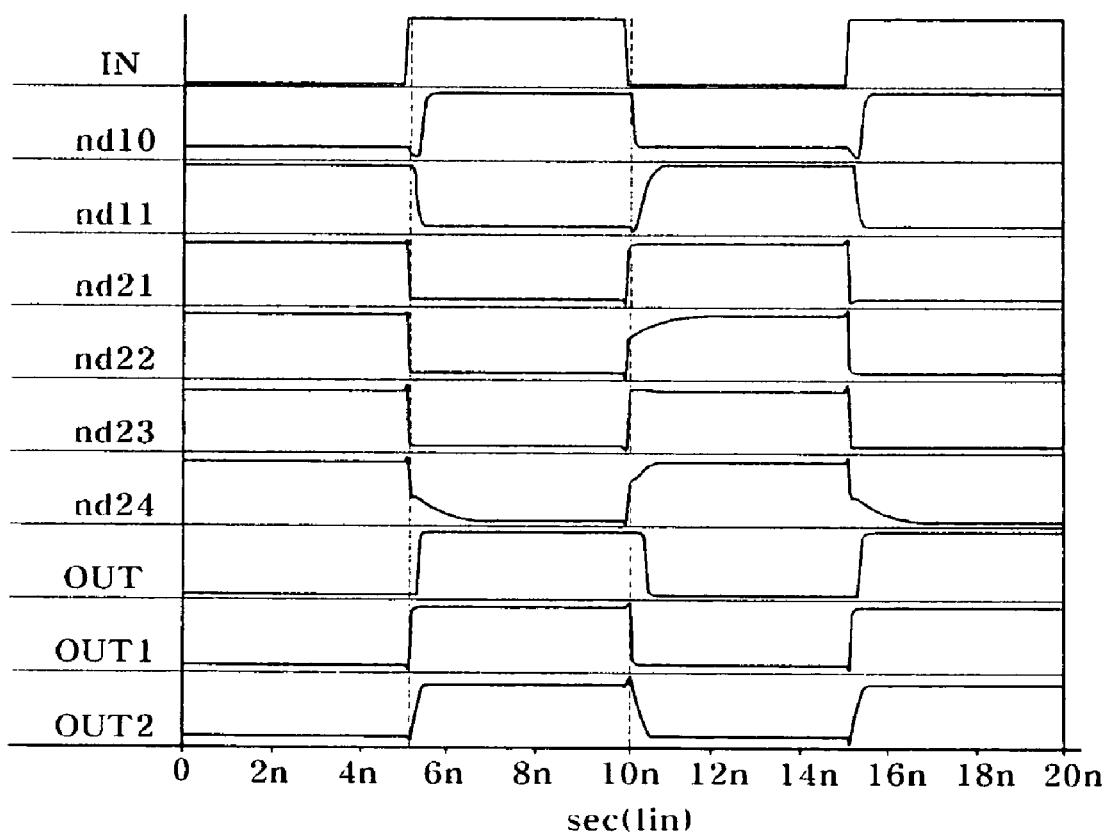
FIG. 5 is a timing chart illustrating operations of the level shifters of FIGS. 3 and 4.

The operations of the conventional level shifter of FIG. 1, the level shifter of FIG. 3 according to one embodiment of the present disclosure, and the level shifter of FIG. 4 according to another embodiment of the present disclosure are shown in FIG. 5.

Referring to the output timing of the output signals OUT and OUT1 in FIG. 5, the level shifter of FIG. 3 according to one embodiment of the present disclosure is shown with an improved operation speed. Further, as the output signal OUT2 is compared with the output signal OUT, the level shifter of FIG. 4 according to another embodiment of the present disclosure is shown with an improved operation speed, especially when the input signal IN transits from the first voltage level V1 to the ground voltage level VSS.

Although examples and embodiments of the present invention have been described for illustrative purposes, those skilled in the art will appreciate that various modifications, additions and substitutions are possible, without departing from the scope and spirit of the invention as disclosed in the accompanying claims.

The present disclosure claims priority to Korean application 10-2008-0037410, filed on Apr. 22, 2008, the entire contents of which are incorporated herein by reference.

What is claimed is:

1. A level shifter comprising:
   a coupling unit configured to receive an input signal and set a voltage level of a first node according to a voltage level of the input signal;
   a first buffer for transferring an output signal by buffering a signal from the first node; and
   a driving unit configured to receive the input signal and the output signal and drive the first node, wherein the input signal received by the driving unit is the same input signal received by the coupling unit.

2. The level shifter of claim 1, wherein the coupling unit includes:
   a second buffer driven by a first voltage level and a ground voltage level and configured to buffer the input signal and transfer the buffered input signal to a second node; and
   a coupling element connected between the first node and the second node and configured to maintain a constant voltage difference between the first node and the second node.

3. The level shifter of claim 2, wherein the coupling element is a capacitor.

4. The level shifter of claim 2, wherein the first buffer is driven by the ground voltage level and a second voltage level which is higher than the first voltage level.

5. The level shifter of claim 4, wherein the driving unit includes:
   a pull-down element connected between the first node and the ground voltage level and configured to pull-down drive the first node in response to the input signal; and
   a pull-up element connected between the second voltage level and the first node and configured to pull-up drive the first node in response to the output signal.

6. The level shifter of claim 5, wherein the pull-down element and the pull-up element are pull-down and pull-up MOS transistors, respectively, and wherein a size of the pull-down MOS transistor is larger than that of the pull-up MOS transistor.

7. The level shifter of claim 2, wherein the first buffer is driven by the second voltage level which is lower than the first voltage level and the ground voltage level.

8. The level shifter of claim 7, wherein the driving unit includes:
   a pull-up element connected between the first voltage level and the first node and configured to pull-down drive the first node in response to the input signal; and
   a pull-down element connected between the first node and the second voltage level and configured to pull-down drive the first node in response to the output signal.

9. The level shifter of claim 8, wherein the pull-down element and the pull-up element are pull-down and pull-up MOS transistors, respectively, and wherein a size of the pull-up MOS transistor is larger than that of the pull-down MOS transistor.

10. A level shifter comprising:
    a first buffer for buffering an input signal and transferring the buffered input signal to a first node;
    a coupling element connected between the first node and a second node and configured to maintain a constant voltage difference between the first node and the second node;
    a pull-down element connected to the second node and configured to receive the input signal and pull-down drive the second node in response to the input signal;
    a second buffer for outputting an output signal by buffering a signal from the second node; and
    a pull-up element connected to the second node and configured to receive the output signal and pull-up drive the second node in response to the output signal.

11. The level shifter of claim 10, wherein the first buffer is driven by a first voltage level and a ground voltage level.

12. The level shifter of claim 11, wherein the second buffer is driven by the ground voltage level and a second voltage level which is higher than the first voltage level.

13. The level shifter of claim 10, wherein the coupling element is a capacitor.

14. The level shifter of claim 10, wherein the pull-down element and the pull-up element are pull-down and pull-up MOS transistors, respectively, and wherein a size of the pull-down MOS transistor is larger than that of the pull-up MOS transistor.

15. A level shifter comprising:
    a first buffer for buffering an input signal and transferring the buffered input signal to a first node;
    a coupling element connected between the first node and a second node and configured to maintain a constant voltage difference between the first node and the second node;
    a pull-up element connected to the second node and configured to receive the input signal and pull-up drive the second node in response to the input signal;
    a second buffer for outputting an output signal by buffering a signal from the second node; and
    a pull-down element connected to the second node and configured to receive the output signal and pull-down drive the second node in response to the output signal.

16. The level shifter of claim 15, wherein the first buffer is driven by a first voltage level and a ground voltage level.

17. The level shifter of claim 16, wherein the second buffer is driven by the first voltage level and a second voltage level which is lower than the ground voltage level.

18. The level shifter of claim 15, wherein the coupling element is a capacitor.

19. The level shifter of claim 15, wherein the pull-down element and pull-up element are pull down and pull up MOS transistors, respectively, and wherein a size of the pull-down MOS transistor is larger than that of the pull-up MOS transistor.

20. A level shifter comprising:
    a set-up unit configured to receive an input signal and set a voltage level of a first node according to the input signal;
    a first buffer for transferring an output signal by buffering a signal from the first node; and
    a pull-up element connected to the first node and configured to receive the output signal and pull-up drive the first node in response to the output signal,
    wherein the set-up unit includes a pull-down element connected to the first node and configured to receive the input signal and pull-down drive the first node in response to the input signal.

21. The level shifter of claim 20, wherein the set-up unit includes:
a second buffer driven by a first voltage level and a ground voltage level and configured to buffer the input signal and transfer the buffered input signal to a second node; and
a coupling element connected between the first node and the second node and configured to maintain a constant voltage difference between the first node and the second node.

22. The level shifter of claim 21, wherein the coupling element is a capacitor.

23. The level shifter of claim 21, wherein the first buffer is driven by the ground voltage level and a second voltage level which is higher than the first voltage level.

24. The level shifter of claim 21, wherein the pull-down element and pull-up element are pull-down and pull-up MOS transistors, respectively, and wherein a size of the pull-down MOS transistor is larger than that of the pull-up MOS transistor.

* * * * *